United States Patent
Tanaka

(10) Patent No.: US 7,989,375 B2
(45) Date of Patent: Aug. 2, 2011

(54) GLASS FIBER COMPOSITION, GLASS FIBER, AND GLASS FIBER CONTAINING COMPOSITION MATERIAL

(75) Inventor: Toshikatu Tanaka, Otsu (JP)

(73) Assignee: Nippon Electric Glass Co., Ltd., Shiga-Ken (JP)

( * ) Notice: Subject to any disclaimer, the term of this patent is extended or adjusted under 35 U.S.C. 154(b) by 391 days.

(21) Appl. No.: 11/988,085

(22) PCT Filed: Jul. 3, 2006

(86) PCT No.: PCT/JP2006/313227
§ 371 (c)(1),
(2), (4) Date: Mar. 24, 2009

(87) PCT Pub. No.: WO2007/004608
PCT Pub. Date: Jan. 11, 2007

(65) Prior Publication Data
US 2009/0312171 A1 Dec. 17, 2009

(30) Foreign Application Priority Data

Jul. 5, 2005 (JP) ................................. 2005-195759
Jun. 27, 2006 (JP) ................................. 2006-177018

(51) Int. Cl.
C03C 13/06 (2006.01)
C03C 13/00 (2006.01)
C03C 3/17 (2006.01)
C03C 3/087 (2006.01)

(52) U.S. Cl. ................ 501/36; 501/35; 501/48; 501/70; 65/384; 65/463

(58) Field of Classification Search .................... 501/35, 501/36, 48, 70; 65/384, 463
See application file for complete search history.

(56) References Cited

U.S. PATENT DOCUMENTS

| | | | |
|---|---|---|---|
| 3,869,268 A | 3/1975 | Briar et al. | |
| 4,093,471 A | 6/1978 | Greig | |
| 5,250,488 A | 10/1993 | Thelohan et al. | |
| RE35,557 E | 7/1997 | Thelohan et al. | |
| 5,962,354 A * | 10/1999 | Fyles et al. | 501/36 |
| 6,158,249 A | 12/2000 | Battigelli et al. | |
| 6,458,436 B1 * | 10/2002 | Hansen et al. | 428/34.5 |
| 6,686,304 B1 * | 2/2004 | Wallenberger | 501/35 |
| 6,933,045 B2 * | 8/2005 | Tamura | 428/364 |
| 6,987,076 B1 * | 1/2006 | Jubb et al. | 501/35 |
| 2005/0009683 A1 | 1/2005 | Hamilton et al. | |

FOREIGN PATENT DOCUMENTS

| | | |
|---|---|---|
| CN | 1059135 | 3/1992 |
| CN | 1071649 | 5/1993 |
| CN | 1126985 | 7/1996 |
| EP | 0 136 024 | 4/1985 |
| EP | 0 525 816 | 2/1993 |
| GB | 2341607 A * | 3/2000 |
| JP | 4-228455 | 8/1992 |
| JP | 5-279072 | 10/1993 |
| JP | 7-215729 | 8/1995 |
| JP | 9-503476 | 4/1997 |
| JP | 9-142871 | 6/1997 |
| JP | 2000-119406 | 4/2000 |
| JP | 2000-247684 | 9/2000 |
| JP | 2003-500330 | 1/2003 |
| JP | 2005-29465 | 2/2005 |
| WO | 95/01941 | 1/1995 |
| WO | 00/73231 | 12/2000 |
| WO | 03/042120 | 5/2003 |

OTHER PUBLICATIONS

International Search Report issued Aug. 1, 2006 in the International (PCT) Application of which the present application is the U.S. National Stage PCT/JP2006/313227.
Chinese Office Action (with English Translation) issued Aug. 14, 2009 in counterpart Chinese Application No. 200680021409.5.
Chinese Office Action (with English translation) issued Apr. 8, 2010 in corresponding Chinese Application No. 200680021409.5.
Patent Cooperation Treaty (PCT) International Preliminary Report on Patentability issued Jan. 9, 2008 in corresponding to International Application No. PCT/JP2006/313227.

* cited by examiner

*Primary Examiner* — Karl Group
*Assistant Examiner* — Elizabeth A Bolden
(74) *Attorney, Agent, or Firm* — Wenderoth, Lind & Ponack, L.L.P.

(57) ABSTRACT

An object is to provide a readily fusible glass fiber composition that can alleviate environmental problem and reduce raw material cost by decreasing boron content, and that can facilitate the manufacturing of fine-count glass filament. A glass fiber composition of the present invention is an oxide glass composition, and has compositions of 0.01 to 3% of $P_2O_5$, 52 to 62% of $SiO_2$, 10 to 16% of $Al_2O_3$, 0 to 8% of $B_2O_3$, 0 to 5% of MgO, 16 to 30% of CaO, and 0 to 2% of $R_2O$ (R=Li+N+K), which are in terms of oxide represented in mass percentage.

7 Claims, No Drawings ly contained, then change of equipments in order to handle fine-count glass fibers due to the shortening of life span of equipments such as a base plate of the bushing. Furthermore, such change of equipments generates a new following manufacturing problem as follows that has not conventionally been envisaged. For example, when a nozzle diameter of the bushing is thinner, the fine foreign matters, which are not a concern conventionally, and the denitrification of molten glass also cause the thread breaking. In an approach for achieving the glass composition that can solve the above problems, it is not possible to readily manufacture the fine-count glass filaments as well as the glass filaments with conventional fiber diameter.

GLASS FIBER COMPOSITION, GLASS FIBER, AND GLASS FIBER CONTAINING COMPOSITION MATERIAL

FIELD OF THE INVENTION

The present invention relates to a glass fiber used as a reinforcing material of a composite material, and a glass fiber composition serving as a forming material thereof, and a glass fiber containing composite material containing glass fiber.

BACKGROUND OF THE INVENTION

Glass fiber (also referred to as glass filament) used as a composite material is manufactured by continuously forming and spinning using a molding apparatus called bushing (also referred to as a platinum heating container) generally having a substantially rectangular appearance. The bushing apparatus, which is arranged at the bottom of the container having a pot shape and having a function of temporally reserving a molten glass, is made of a heat resistant metallic material such as platinum, and has a multiple nozzle portions (or orifice portions), and presents an appearance such as a container. According to the bushing apparatus, temperature is controlled such that the molten glass has an optimum temperature at the top of the bushing nozzle, that is, the uniformly molten glass has a temperature near the temperature corresponding to high-temperature viscosity of $10^3 dPa \cdot s$, and thereby the molten glass continuously flows out of the bushing nozzles and rapidly cooled to form and to be spined as a glass fiber.

In the case where the glass fiber is formed in this manner, when a liquidus temperature Ty of the molten glass is equal to or core than a spinning temperature, which serves as a glass forming temperature Tx, crystals causing devitrification in the vicinity of the bushing nozzle are easily precipitated in the molten glass. As a result, the bushing nozzle gets clogged which causes thread breaking that is also referred to as "break." Therefore, the liquidus temperature Ty of the molten glass needs to be lower than the spinning temperature (equal to the forming temperature Tx) (i.e., a temperature difference $\Delta Txy=Tx-Ty>0$). To increase the difference ($\Delta Txy$) between the liquidus temperature Ty of the molten glass and the spinning temperature Tx as much as possible, the spinning temperature Tx can be increased. However, it is not preferable since it causes an increase in manufacturing cost due to the increase in energy required for the melting, or causes a problem of reducing the life span of attached equipments such as a bushing apparatus. Therefore, it is preferable that the temperature difference $\Delta Txy$ is increased and the forming temperature Tx is reduced.

On the other hand, in the manufacturing of glass fiber, the reduction of the boron (B) content in glass composition has been attempted, taking the environmental pollution problem into consideration. In addition, since the raw material serving us a boron source is expensive, it becomes important to decrease the boron content in glass composition in order to achieve reduction in the manufacturing cost of glass fiber. From this viewpoint, all Patent Documents 1, 2 and 3 try to achieve the object by limiting the glass composition.

Moreover, for the applications in a functional member requiring fine structural control, a fine-count glass fiber product is strongly in demand. For example, a printed wiring substrate or the like needs to drill or laser machine a through hole (referred to as via hole, via, inner via hole, blind via hole, or the like) of 0.1 mm or less, which connects any conductor layers provided through an insulating substrate. It has been found that it is preferable to use the fine-count glass fiber as a glass fiber constituting a base material in order to apply such high-precision machining to the substrate.

To spin the fine-count glass fiber, a nozzle diameter of the bushing can be reduced. However, the thinner the nozzle diameter is, the more likely the problem of creep deformation or the like of the nozzle is to occur, thereby leading to a problem of short durable time of a base plate of the bushing. To avoid these problems, Patent Documents 4 and 5 and other documents provide inventions in which the shapes of bushing or nozzle are restricted. Moreover, when the glass fiber is formed by the bushing in the above manner, the nozzle clogging causes fiber breakage and reduces production yield. Hence, the prevention of these is important. Patent Document 6 provides an invention in which a weir is arranged to prevent any heterogeneous foreign matters from flowing into nozzles.

Patent Document 1: Japanese Patent Unexamined Publication No. 2000-247684

Patent Document 2: Japanese Patent Unexamined Publication No. 2005-29465

Patent Document 3: Japanese Translation No. 2003-500330 of PCT International Application Patent Document 4: Japanese Patent Unexamined Publication No. 5-279072

Patent Document 5: Japanese Patent Unexamined Publication No. 7-215729

Patent Document 6: Japanese Patent Unexamined Publication No. 9-142871

SUMMARY OF THE INVENTION

However, it is difficult to achieve a sufficiently high level of effectiveness by only the various improvements which have been made so far, and further improvement is required. For example, the reduction in boron (B) component, which is required to address the environmental problems and to reduce raw material cost, has a basic problem of inferior dissolution of glass caused by decreasing the boron component more than conventional molten glass compositions. Therefore, some countermeasures such as significant improvement of manufacturing equipment's ability are often required, resulting in expensive manufacturing cost in total. In addition, there is limitation in changing of equipments in order to handle fine-count glass fibers due to the shortening of life span of equipments such as a base plate of the bushing. Furthermore, such change of equipments generates a new following manufacturing problem as follows that has not conventionally been envisaged. For example, when a nozzle diameter of the bushing is thinner, the fine foreign matters, which are not a concern conventionally, and the denitrification of molten glass also cause the thread breaking. In an approach for achieving the glass composition that can solve the above problems, it is not possible to readily manufacture the fine-count glass filaments as well as the glass filaments with conventional fiber diameter.

Under such circumstances, an object of the present inventor is to ensure the reduction in boron content within glass composition (i.e., $B_2O_2$ content when indicated in terms of oxide) required to address the environmental problems and to reduce raw material cost, and to provide; a glass fiber composition having fusibleness by which the dissolution of glass is less likely to be affected, and moreover allowing the facilitation of manufacturing the fine-count glass filament; a glass fiber made of the glass fiber composition; and a glass fiber containing composite material containing the obtained glass fiber.

The glass fiber composition of the present invention is characterized in that it is an oxide glass composition and has compositions of 0.01 to 3% of $P_2O_5$, 52 to 62% of $SiO_2$, 10 to 16% of $Al_2O_3$, 0 to 8% of $B_2O_3$, 0 to 5% of MgO, 16 to 30% of CaO, and 0 to 2% of $R_2O(R=Li+Na+K)$, which are in terms of oxide represented in mass percentage.

Here, $R_2O(R=Li+Na+K)$, is the total amount of the oxides of Li, Na and K which are alkali metals.

In the glass fiber composition of the present invention, $P_2O_5$ component is a component having an effect of suppressing the formation of fine crystal nuclei within the molten glass. In particular, the effect is obtained by a function of reducing crystallization temperature of wollastonite (Wo) ($CaO.SiO_2$) or diopside (Di) ($CaO.MgO.2SiO_2$). However when the content is less than 0.01 mass %, a great effect cannot be expected. On the other hand, when the content is more than 3 mass %, the glass is most likely to be devitrified and thus it is not preferable.

$SiO_2$ component is a component constituting the skeleton structure of an oxide glass and greatly contributing to the strength of glass articles, the standard chemical durability, and the viscosity during the melting. When the $SiO_2$ component is less than 52 mass %, the mechanical strength of the glass fiber is reduced and thus it is not preferable. When the $SiO_2$ component is more than 62 mass %, the viscosity of the molten glass is too high and homogeneous melting is less likely to be achieved. As a result, problems of difficulty in adjusting the glass fiber diameter and difficulty n forming the glass fiber are more likely to arise, and thus it is not preferable.

$Al_2O_3$ component is a component enhancing the initial dissolution of glass and having an effect of improving devitrification. When the $Al_2O_3$ component is less than 10 mass %, the glass is more likely to be devitrified and thus it is not preferable. When $Al_2O_3$ component exceeds 16 mass %, the viscosity of the glass becomes too high, though not to the extent of the $SiO_2$ component, and there is concern that a problem on the formation or the like occurs. Thus, it is not preferable.

$B_2O_3$ component is a component having a function of reducing a melting temperature of the glass by reducing the viscosity of the glass, and enhancing the dissolution of the glass. However, the raw material is generally expensive, and moreover evaporation from the molten glass increases when a large amount of $B_2O_3$ component is included in the glass. Therefore, it is not preferable to include a large amount of $B_2O_3$ component in the glass in terms of the environmental protection. A moderate amount of $B_2O_3$ component can be included in the glass for enhancing the dissolution, but the content thereof may be 8 mass % or less in terms of oxide. For the similar reasons, the content is preferably 7% or less, more preferably 6% or less, and further more preferably 5% or less.

Both MgO component and CaO component are oxide components of alkaline-earth metal and improve the dissolution of the molten glass. The effect is significantly exhibited when the content of the MgO component is up to 5 mass % in terms of oxide, and preferably in the range of 0.1 mass % to 5 mass %. When the MgO component exceeds 5 mass % in terms of oxide, diopside (Di) ($CaO.MgO.2SiO_2$) is likely to be precipitated and the liquidus temperature increases, and thus it is not preferable. When the MgO component is less than 0.1%, wollastonite (Wo) ($CaO.SiO_2$) is likely to be precipitated, and thus it is not preferable. From the above viewpoint, the MgO component is preferably 0.1 mass % to 3.5 mass %.

Like the MgO component, CaO component also contributes to enhance the dissolution of the glass. Regarding the content of the CaO component, when the content is less than 16 mass %, the viscosity of the molten glass increases and fusibility and spinnability get worse. On the other hand, when the content of the CaO component exceeds 30 mass % in terms of oxide, wollastonite (Wo) ($CaO.SiO_2$) is likely to be precipitated and thus it is not preferable. Therefore, the content of the CaO component is in the range of 16 mass % to 30 mass % in terms of oxide. From the above viewpoint, the content of the CaO component is more preferably in the range of 20 mass % to 28 mass %.

$R_2O(R=Li+Na+K)$ component refers to the total amount of alkali metal components of lithium, sodium, and potassium and is indicated in terms of oxide. All the components have a function of significantly enhancing the dissolution of the glass and the spinnability of the glass fiber. However, when the content thereof is too high, the composite material has a problem of difficulty in maintaining the strength over time. Thus, the content is preferably 2 mass % or less, and more preferably 1.6 mass % or less. Regarding $R_2O$, if a raw material constitution in high-purity chemical products is adopted. $R_2O$ may not substantially be contained in the composition. If a stable quality can be obtained even by using a natural raw material containing the $R_2O$ component, the $R_2O$ component may be contained to have 0.4% or more. In other words, the content of $R_2O(R=Li+Na+K)$ can be preferably 0.3 to 2% and more preferably 0.3 to 1.0%, or $R_2O(R=Li+Na+K)$ can be preferably 0.4 to 2% and more preferably 0.4 to 1.6%.

In addition to the above conditions, when the glass fiber composition of the present invention has 0.1 to 5% of MgO in terms of mass percentage, fine crystals are much less likely to occur within the molten glass and thus it is preferable.

In other words, when the content of the MgO component is limited to the range of 0.1 to 5% in terms of oxide represented in mass percentage, it is possible to form a stable molten glass which is less likely to precipitate wollastonite (Wo) crystals. Therefore, the content range is preferable for the glass fiber composition.

In addition, when the glass fiber composition of the present invention has the forming temperature Tx of 1250° C. or less, at which the viscosity of the molten glass is $10^3$ dPa·s, and the liquidus temperature Ty of 1150° C. or less, it is easy to maintain the state where no crystal is precipitated in the molten glass during the formation of the glass monofilament. Thus, it is preferable.

Here, the forming temperature Tx of 1250° C. or less, at which the viscosity of the molten glass is $10^3$dPa·s, means that the temperature at which the viscosity of the molten glass is 1,000 pose under a high-temperature condition is 1250° C. or less. The liquidus temperature Ty of 1150° C. or less means that the temperature at which a specified crystal phase is generated as an initial phase is 1150° C. or less.

The important physical factors of the glass for obtaining fiber-like molten glass in a melt-spinning process are a surface tension and a viscosity of the molten glass. The surface tension of the molten glass less depends on temperatures and typically is about 300 dyn/cm. Accordingly, viscosity is a key for forming the molten glass as a monofilament. The present inventor discovered, from studies, that it is important to set the liquidus temperature Ty at 1150° C. or less and the forming temperature Ty, which is the temperature in the case where the viscosity at high temperatures is $10^3$dPa·s, at 1250° C. or less such that the forming operations of the fine-count glass fiber can be achieved in sufficiently plenty of time. Moreover, when the temperature difference therebetween is at least 100° C. as in the aforementioned case, the forming conditions can be widen, and it is possible to handle from fine-count glass fibers to thicker-count glass fibers. The glass fiber composition of the present invention is presented as the composition which con satisfy such conditions.

In addition to the aforementioned conditions, when the glass fiber composition of the present invention has the temperature difference ΔTxy of 100° C. or more between the forming temperature Tx end the liquidus temperature Ty, more stable glass fiber can be formed. Thus, it is preferable.

In this manner, where the liquidus temperature Ty is set at a temperature sufficiently lower than the forming temperature Tx, no fine crystal is precipitated in the molten glass and stable grade can be maintained even though the temperature of the molten glass varies by the subtle variations of the forming conditions at the forming temperature Tx, the change of the diameter dimension of the molded fiber, or the like.

The glass fiber composition of the present invention can include a moderate amount of $SrO$, $BaO$, $TiO_2$, $ZrO_2$, $As_2O_3$, $SnO_2$, $ZnO$, $Sb_2O_3$, $SO_3$, $Cl_2$, $H_2O$, He, Ar, Xr, $H_2$, Fc, N, W, Mo, Pt, Rh, Ag, Au, Cu, Hg, Nh, or the like, other than the aforementioned components, if necessary. In particular, 0.01 ppm to 1,000 ppm of $O_3$, $CO_2$, CO, $SO_3$, $N_2$, $Cl_2$, $H_2O$, He, Ne, Ar, Xr or $II_2$, which are gaseous components, can be contained in the glass fiber composition.

Note that the glass fiber composition of the present invention may contain fine crystals as long as no problem occurs in the characteristics and the applications of the glass fiber.

The glass fiber of the present invention is characterized in that it is obtained by forming the glass fiber composition having the aforementioned glass composition by the bushing apparatus.

For example, the glass fiber of the present invention is formed by the bushing apparatus in a direct melt method (DM method).

Any type of bushing apparatus can be utilized, as long as it has desired heat resistance and sufficient strength, and has a predetermined opening for the molten glass to flow out to a part of the container. Structures of other portions of the bushing apparatus, existence of the attached device, or the like is not of concern. Moreover, overall dimension or shape of the bushing apparatus, as well as heating method, the number of holes, hoe dimension, hole shape, nozzle shape or the number of nozzle, are not being particularly limited. Furthermore, the bushing apparatus made of any material can be utilized so long as it has a predetermined strength. A particularly preferable example is a bushing apparatus made of a heat-resistant metal containing platinum.

Moreover, the glass fiber of the present invention can adopt any method as heating method, homogenizing method, or the like of the molten glass flowing into the bushing apparatus. The flow rate of the molten glass and the raw material constitution are also not being limited.

Moreover, the glass fiber of the present invention can adopt, as a manufacturing method, an indirect molding process using the bushing apparatus to achieve small-quantity production as need arises.

Furthermore the glass fiber of the present invention can be manufactured by, instead of the use of the still standing bushing apparatus, rotating a container made of a heat-resistant alloy if necessary (in other words, by moving the bushing apparatus itself), injection molding the molten glass by centrifugal force from a small hole provided on the wall of the container, and blowing off the molten glass during the heating, particularly in the manufacturing of short fibers. Otherwise, short fibers can be manufactured by blowing off the molten glass injected from the bushing apparatus using vapor, compressed air, flame, or the like. Alternatively, the molten glass can be blown off by rotating a drum with the molten glass carried thereon.

In addition to the aforementioned methods, the glass fiber of the present invention is formed while measuring and controlling the forming temperature Tx of the molten glass by the bushing apparatus to be in the range of ±20° C. with respect to the target temperature. Thus, a bushing temperature can be appropriately fine-tuned so as to suppress the variation of the diameter of the formed glass fiber, and thereby the viscosity of the formed glass fiber can be nightly stabilized.

Regarding measurement and control of the forming temperature Tx, temperatures can be measured by any type of measuring means, as long as it can measure and control the forming temperature Tx in the range of ±20° C. with respect to the target temperature. For example, temperatures can be measured by thermocouples or optical means such as an optical pyrometer. The measuring results can be monitored by a program or the like as needed. High-accuracy measurement can be achieved by adding to the bushing apparatus a heating/cooling system which can quickly respond to the rapid increase or decrease in temperatures.

In addition, the glass fiber of the present invention can be used in various applications, as long as it has the molded product form of any of chopped strand, yarn or roving.

Here, chopped strand is a short fiber having a predetermined length, yarn is a continuous twisted filament, and roving is a bundle of a plurality of strands.

The length and fiber diameter of chopped strand is not being limited. Fiber length and fiber diameter can be selected depending on the application. In addition, any type of chopped-strand manufacturing method can be adopted. Short fibers can be formed in the melting process, or may be formed by forming a long fiber once and then cutting it by a cutting device depending on the application. In the latter case, any type of cutting method can be adopted. For example, a peripheral cutting-edge cutting device, an inner-periphery cutting-edge cutting device, a hammer mill, or the like can be utilized. Moreover, the aggregated form of chopped strand is not particularly limited. Specifically, the chopped strand can be formed by randomly stacking the glass fibers, which are cut to the appropriate length, in a plane and using a specified bonding agent. Alternatively, the chopped strand can be in a state of being randomly pled up in three dimensions. Alternatively, the chopped strand may be in a state of being arranged n one dimension that is being in parallel to a specified axial direction, and being consolidated by a predetermined agent (i.e., a resin or the like) (which are also referred to as glass masterbatch (GMB) pellet, resin pillar body, LFTP, or the like).

Regarding yarn, the size, direction and the like of the twisting of yarn are not being particularly limited, including a twistless yarn, as long as it has a predetermined twist.

Regarding roving, any appearance is acceptable and the diameter of the wound fiber and the number of bundled strands are not being limited, as long as it bundles a plurality of strands and cylindrically winds it off.

The glass fiber of the present invention can also utilized as a form of continuous strand mat, bonded mat, cloth, tape, braided rope, milled fiber, or the like, other than those above. Alternatively, the glass fiber of the present invention can be resin-impregnated prepreg. The use, the molding and the like of the glass fiber can apply to spray up, hand lay-up, filament winding, injection molding, centrifugal molding, roller molding, BMC, SMC methods, which utilize a matched die, or the like.

In addition the glass fiber of the present invention can be provided with a predetermined performance by applying various surface treating agents thereto. For example, a moderate amount of a binder, a binding agent, a coupling agent, a lubricant agent, an antistatic agent, an emulsifying agent, an emulsion stabilizer, a pH adjuster, an antiforming agent, a coloring agent, an antioxidant, a fungicide, or a stabilizer can be, independently or in any combination, applied to and covered with the surface of the glass fiber. Such surface treating agent or coating agent may be a starch-based or plastic-based agent.

For example, in the case of a binder for FRP, acryl, epoxy, urethane, polyester, vinyl acetate, ethylene vinylacetate copolymer, or the like can be used as appropriate.

The glass fiber containing composite material of the present invention is characterized in that it is formed by combining the aforementioned glass fiber with organic medium, concrete, or mortar.

Here, the organic medium is represented by organic resins such as thermoplastic resin or thermosetting resins. The concrete is a mixture of cement, sand, aggregate, and water, and the mortar is a mixture of cement, sand, and water.

Regarding the type of organic medium, optimum resins can be appropriately used independently or in combination, depending on the applications. The organic medium can be used together with other structural reinforcing material, such as carbon fiber or ceramic fiber and beads material.

Blending ratio of various components constituting the concrete or the mortar and types of the cement are also not being particularly limited. Fly ash or the like can be added.

Specifically, the glass fiber composite material of the present invention can be utilized in the following applications. For example, in application related to electronics, the glass fiber composite material of the present invention can be applied to printed wiring board, insulating plate, terminal plate, IC substrate, electronics housing material, gear tape reel, various storage cases, package for optical components, package for electronic components, switch box, insulating support, or the like. In application related to vehicle installation, the glass fiber composite material of the present invention can be applied to material for vehicle roof (roof material), window frame material, vehicle front, car body, lamp house, air spoiler fender grill, tank trolley, ventilator, water tank, sewage storage tank, seat, nose cone, curtain, filter, air conductor, muffler filter, dash panel, fan blade, radiator tire, timing bell, or the like. In application related to aircraft, the glass fiber composite material of the present invention can be applied to engine cover, air duct, seat frame, container, curtain, interior material, service tray, tire, vibration-proofing material, timing belt, or the like. In application related to shipbuilding, land transportation and marine transportation, the glass fiber composite material of the present invention can be applied to motor boat, yacht, fishing boat, dome, buoy, marine container, floater, tank, traffic light, road sign, curved mirror, container, pallet, guardrail, panel light cover, spark protecting sheet, or the like. In application related to agriculture, the glass fiber composite material of the present invention con be applied to plastic greenhouse, silo tank, spray nozzle, supporting post, lining, sol conditioner, or the like. In application related to civil engineering, construction, and building material, the glass fiber composite material of the present invention, can be applied to bath tub, unit of bath and toilet, toilet bowel, digestion tank, water tank, inferior panel, capsule, bulb, knob, wall reinforcing material, precast concrete board, flat plate, sheet, tent, shutter, covering panel, sash, piping, reservoir, pool, road, building side wall, concrete formwork, tarpaulin, waterproof lining, curing sheet, insect screen, or the like. In application related to industrial facility, the glass fiber composite material of the present invention can be applied to bag filter, sewer piping, water purifying relaxed apparatus, vibration-proofing concrete reinforced material (GRC), water tank, belt, agent tank, reaction tank, container, fan, duct, anticorrosion lining, bulb, refrigerator, tray, freezer, trough, device component, electric motor cover, insulating wire, transformer insulation, cable cord, work suit, curtain, evaporation panel, device housing, or the like. In application related to leisure and sports, the glass fiber composite material of the present invention can be applied to fishing rod, ski goods, archery, golf club, pool, canoe, surf board, camera housing, helmet, anti-shock protective equipment, flower pot, display board, or the like. In application related to commodities, the glass fiber composite material of the present invention can be applied to table, chair, bed, bench, mannequin, trash, mobile phone terminal protective material, or the like.

Moreover, the glass fiber of the present invention can be independently utilized. For example, in a liquid crystal display used as a display of a liquid crystal television or personal computer, the glass fiber is preferably used for a liquid crystal spacer which is used to keep the gap between two substrate glasses since the glass fiber has a fiber diameter with stable dimensional accuracy.

Furthermore, the glass fiber composition (glass fiber) of the present invention can be recycled. Specifically, goods containing the glass fiber composition (glass fiber) of the present invention can be formed into fiber form or various forms other than fiber form, such as spherical form and granular form, through a remelting process, and the remelted glass fiber can be used in other applications. The glass fiber composition can be used as, for example, additives for soil, additives or aggregate material for concrete, additives for asphalt, or the like.

EFFECT OF THE INVENTION (1) As described above, the glass fiber composition of the present invention has compositions of 0.01 to 3% of $P_2O_5$, 52 to 62% of $SiO_2$, 10 to 16% of $Al_2O_3$, 0 to 8% of $B_2O_3$, 0 to 5% of MgO, 16 to 30% of CaO, and 0 to 2% of $R_2O$ (R=Li+Na+K). This allows vaporization of B component, which causes environmental problems, to decrease, and high-quality glass fiber to be obtained without reducing production yield caused by thread breaking even during the manufacturing of fine-count glass fiber.

(2) In addition to the above conditions, as long as the glass fiber composition of the present invention includes 0.1 to 5% of MgO in terms of oxide represented in mass percentage, even the composition having a batch configuration with low solubility can be uniformly melted, and thus obtaining the glass fiber that can achieve desired performances.

(3) In addition to the above conditions, as long as the forming temperature Tx, at which the viscosity of the molten glass is $10^3$ dPa·s, is 1250° C. or less and the liquidus temperature Ty is 1150° C. or less, the glass fiber composition of the present invention can effectively prevent thread breaking caused by the generation of crystal foreign matters in the vicinity of bubbling nozzle.

(4) In addition to the above conditions, as long as the glass fiber composition of the present invention has the temperature difference ΔTxy of 100° C. or more between the forming temperature Tx and the liquidus temperature Ty, the glass fiber with stable quality can be continuously produced by adopting optimum manufacturing conditions for the manufacturing of various kinds of fine-count glass fibers.

(5) The glass fiber of the present invention is obtained by molding the aforementioned glass fiber composition with the bushing apparatus. Therefore, a large amount of glass fiber having the desired diameter can be continuously produced and adjusted such mat the variable diameter of the obtained glass fiber is within the predetermined range.

(6) In addition to the above conditions, as long as the glass fiber of the present invention is formed while measuring and controlling the forming temperature Tx of the molten glass to be in the range of ±20° C. with respect to the target temperature, the molten glass being formed with the bushing apparatus, the glass fiber will have high dimensional grade by cooperating with a system executing processing in accordance with temperature variations at the formation.

(7) In addition to the above conditions, as long as the molded product is shaped into any of chopped strand, yarn and roving, the glass fiber of the present invention can have an optimum form needed in each application.

(8) The glass fiber containing composite material of the present invention is formed by combining the aforementioned glass fiber with organic medium, concrete or mortar. Therefore, stable physical strength can be achieved for a long duration, which cannot be achieved by organic medium, concrete, or mortar independently.

DETAILED DESCRIPTION OF THE INVENTION

Hereinafter, a glass fiber composition and a glass fiber of the present invention, and composite material using the same will be described in detail based on the Examples.

Example 1

Table 1 shows compositions of the glass fiber composition according to the example of the present invention and evaluation results thereof. In the table, glass composition is indicated in terms of mass %.

TABLE 1

| | Example Sample No. | | | | | |
|---|---|---|---|---|---|---|
| | 1 | 2 | 3 | 4 | 5 | 6 |
| $SiO_2$ | 54.4 | 54.6 | 58.7 | 52.5 | 54 | 54.8 |
| $Al_2O_3$ | 13.7 | 13.3 | 14.1 | 12.8 | 15.6 | 13.1 |
| $B_2O_3$ | 5 | 4.5 | 0 | 6.5 | 2.5 | 5.5 |
| MgO | 2.2 | 2.8 | 2.9 | 0.5 | 3.1 | 1.7 |
| CaO | 23.5 | 22.8 | 22.6 | 26.5 | 21.7 | 23.8 |
| $Na_2O$ | 0.7 | 1.4 | 0.8 | 0.7 | 1.1 | 0.4 |
| $K_2O$ | | | | | | |
| $Li_2O$ | | | | | | |
| $Fe_2O_3$ | 0.2 | 0.2 | 0.2 | 0.2 | 0.2 | 0.2 |
| $TiO_2$ | 0.2 | 0.2 | 0.2 | 0.2 | 0.2 | 0.2 |
| $P_2O_3$ | 0.1 | 0.2 | 0.5 | 0.1 | 1.6 | 0.3 |
| Forming Temperature (Tx) [$10^3$ dPa·s] | 1184 | 1189 | 1250 | 1178 | 1187 | 1186 |
| Liquid Phase Temperature (Ty) | 1066 | 1073 | 1136 | 1057 | 1063 | 1052 |
| ΔTxy | 118 | 116 | 114 | 121 | 124 | 134 |
| Precipitated Crystal | Wo | Di | Di | Wo | Di | Wo |

Each glass sample of Sample Nos. 1 to 6 in the example was prepared and evaluated by the following procedure.

First, a glass batch row material formed by weighting out and mixing together a predetermined amount of glass raw materials that constitute each glass composition was introduced in platinum-rhodium crucible, and was heated and melt within an indirect hearing type electric furnace in atmosphere at 1500° C. fox five hours. The molten glass was stirred using heat-resistant stirring rod during the heating and melting in order to form homogeneous molten glass.

Thereafter, the homogeneous molten glass was introduced into a carbon mold to be cast into a predetermined shape, the resultant was slowly cooled, and the final glass molded body for measurement was obtained.

Physical properties of each glass composition in the example shown in Table 1 were measured by the following procedure.

The forming temperature Tx corresponding to the viscosity of the molten glass of $10^3$ dPa·s was calculated by interpolation of the viscosity curve, which was obtained by measuring viscosity, values at several timings according to a platinum sphere pulling method after each glass molded body was introduced into an alumna crucible, was subjected to reheating, and was heated until it melted.

Regarding the liquidus temperature Ty, each glass molded body was cut into a predetermined form to be grinded to have a predetermined grain size, was adjusted n de grain-size range of 300 to 500 μm to have a predetermined range of surface area by removing fine ground products, was filled into a platinum container to have an appropriate bulk density, was introduced into and left at rest in an indirect heating-type temperature gradient furnace of which maximum temperature was set at 1250° C. and was heated in the atmosphere for 16 hours. Thereafter, the test pieces were taken out together with the platinum container and were left to cool to room temperatures, and thereafter, precipitated crystals were identified by a polarization microscope and the liquidus temperature Ty serving as a perception temperature was specified. In Table 3, the crystallization of wollastonite ($CaO.SiO_2$) is denoted by Wo and the crystallization of diopside ($CaO.MgO.2SiO_2$) is denoted by Di.

According to the above tests, Sample Nos. 1 to 6 in the example of the present invention contained a moderate amount of $P_2O_5$ component as shown in Table 1, and had the glass composition suitable for forming the glass fiber. Therefore, the forming temperature Tx was in the range of 1178 to 1250° C. (1250° C. or less) while the liquidus temperature Ty was in the range of 1052 to 1136° C. (1150° C. or less), and the value ΔTxy of the forming temperature Tx—the liquidus temperature Ty of each sample No. was in the range of 114 to 134° C. (100° C. or more). Hence, the samples were preferable to be utilized as the glass fiber composition of the present invention.

Comparison Example

Next, the samples in comparison example were prepared in a manner similar to that of the example of the present invention. The compositions and the evaluation results of Sample Nos. 7 to 10 in the comparison example are summarized in Table 2.

TABLE 2

| | Comparison Example Sample No. | | | |
|---|---|---|---|---|
| | 7 | 8 | 9 | 10 |
| $SiO_2$ | 55.6 | 56.0 | 54.3 | 50.2 |
| $Al_2O_3$ | 13.2 | 13.5 | 13.7 | 11.6 |
| $B_2O_3$ | 3 | — | 5 | 5.1 |
| MgO | 2.6 | 2.5 | 5.7 | 1.2 |
| CaO | 23.3 | 23.5 | 20 | 30.5 |
| $Na_2O$ | 0.9 | 0.7 | 0.7 | 0.7 |
| $K_2O$ | | | | |
| $Li_2O$ | | | | |
| $Fe_2O_3$ | 0.3 | 0.1 | 0.2 | 0.2 |
| $TiO_2$ | 1.1 | 0.2 | 0.2 | — |
| $P_2O_5$ | — | 3.5 | 0.2 | 0.5 |
| Forming | 1204 | 1096 | 1181 | 1173 |

TABLE 2-continued

| | Comparison Example Sample No. | | | |
|---|---|---|---|---|
| | 7 | 8 | 9 | 10 |
| Temperature (Tx) [$10^3$ dPa · s] Liquid Phase Temperature (Ty) | 1127 | Phase Separation and Devitrification | 1160 | 1238 |
| ΔTxy | 77 | — | 21 | −65 |
| Precipitated Crystal | Wo | — | Di | Wo |

The comparison example was evaluated using the same apparatus and method as the previously described evaluation method of the example.

The glass composition of Sample No. 7 in the comparison example had less content of $B_2O_3$ component and contained no $P_2O_5$ component. As a result, the liquidus temperature Ty was 1127° C. which was below 1150° C., but the temperature difference ΔTxy of the forming temperature Tx—the liquidus temperature Ty was 77° C. which was below 100° C. In this case, the thread breaking problem may occur.

The glass composition of Sample No. 8 in the comparison example had little content of $H_2O_3$ component but had much content of $P_2O_5$ component, 3.5 mass %. Thus, the glass was devitrified and spinning itself was difficult. Therefore, the sample was an inappropriate material for manufacturing of the glass fiber.

The glass composition of Sample No. 9 in the comparison example had little content of $B_2O_3$ component and contained a moderate amount of $P_2O_5$ component, but had much content of MgO component, i.e., 5.7 mass %. Thus, crystals of diopside (Di) were precipitated at 1160° C., and as a result, the value ΔTxy of the forming temperature Tx—the liquidus temperature Ty was 21° C. Since diopside (Di) which caused the thread breaking was generated, the sample was an inappropriate material for manufacturing of the fine-count glass fiber.

The glass composition of Sample No. 10 in the comparison example had little content of $B_2O_3$ component and contained a moderate amount of $P_2O_5$ component, but had much content of CaO component, i.e., 30.5 mass %. The liquidus temperature, at which wollastonite (Wo) crystals were precipitated, was 65° C. higher than the forming temperature. Therefore, since fine crystals of wollastonite (Wo), which inhibited the formation of the glass fiber. were generated, the sample was inappropriate for manufacturing the better-quality glass fiber.

Hence, it is clear that the example of the glass fiber composition of the present invention kept the content of boron (B) component to be low, had the liquidus temperature suitable for manufacturing of the fine-count glass fiber, and had a high level of fusibility.

Example 2

Next, a glass fiber which can be achieved using the glass fiber composition of the present invention and a glass fiber containing composite material thereof will be described.

For example, when the bushing apparatus having a platinum nozzle was utilized after the glass fiber composition having the glass composition of Sample No. 1 in Example 1 was melted, a glass monofilament having a diameter of 3 μm can be continuously formed. Even when it was continuously formed, thread breaking was less likely to occur, and thus the glass fiber can have a stable fiber diameter, h addition, the glass monofilament has a low content of boron (B) component. Therefore, it is not necessary to include any additional specific apparatus in the manufacturing equipment for the recovery of exhaust gas or the like.

Moreover, the bushing apparatus is designed such that a system is activated, the system being always able to monitor the temperature of the molten glass within the bushing apparatus, which corresponds to bushing temperatures measured by thermocouple. The range of the monitoring temperatures is ±20° C. with respect to the target forming temperature. If the forming temperature decreases, the heating is conducted to rectify it, and thereby stable formation and spinning can be achieved.

A moderate amount of silane coupling agent or the like is applied to the surfaces of the formed glass fiber by a dipping method and is air dried to obtain a filament coated with binder. A plurality of this filaments are bundled, are hardened using an organic medium composed, of polypropylene resin, and are cut into a desired length. Thereby, LFTP in which the glass fibers are arranged as chopped strand in the same direction can be obtained.

Since defects of the glass fiber are reduced by using such obtained LFTP (referred to as pellet compact), the glass fiber can be easily formed into a thin-plate-like object which can utilized in electronic-component application. Moreover, when the mechanical performance of the plate-like object, such as bending strength or the like, is evaluated, it exhibits a performance equal to or higher than the conventional products.

Hence, the glass fiber using the glass fiber composition of the present invention and the glass fiber, containing composite material exhibit a superior performance, and can be applied in all industrial fields.

What is claimed is:

1. A glass fiber composition, wherein in that the glass fiber composition is an oxide glass composition, and has 0.01 to 3% of $P_2O_5$, 52 to 62% of $SiO_2$, 12.8 to 16% of $Al_2O_3$, 2.5 to 8% of $B_2O_3$, 0 to 3.5 of MgO, 21.7 to 30% of CaO, and 0 to 2% of $R_2O(R=Li+Na+K)$, which are in terms of oxide represented in mass percentage.

2. The glass fiber composition of claim 1, having 0.1 to 3.5 of MgO.

3. The glass fiber composition of claim 1, wherein a forming temperature Tx, at which a viscosity of a molten glass is $10^3$ dPa·s, is 1250° C. or less, and a liquidus temperature Ty is 1150° C. or less.

4. The glass fiber composition of claim 1, wherein a temperature difference ΔTxy between the forming temperature Tx and the liquidus temperature Ty is 100° C. or more.

5. A glass fiber obtained by forming the glass fiber composition of claim 1 with a bushing apparatus.

6. The glass fiber of claim 5, wherein the glass fiber is formed while measuring and controlling the forming temperature Tx of the molten glass to be in the range of ±20° C. with respect to a target temperature, the molten glass being formed with the bushing apparatus.

7. The glass fiber of claim 5, for a molded product which is formed of chopped strand, yarn, and roving.

* * * * *